United States Patent [19]

Sakamoto

[11] 4,047,112

[45] Sept. 6, 1977

[54] CHANNEL SELECTOR EMPLOYING VARIABLE CAPACITANCE ELEMENTS FOR TUNING

[75] Inventor: Yoichi Sakamoto, Toyonaka, Japan

[73] Assignee: Matsushita Electric Industrial Co., Ltd., Osaka, Japan

[21] Appl. No.: 449,757

[22] Filed: Mar. 11, 1974

Related U.S. Application Data

[63] Continuation of Ser. No. 194,998, Nov. 2, 1971, abandoned, which is a continuation of Ser. No. 853,165, Aug. 26, 1969, abandoned.

[30] Foreign Application Priority Data

| Aug. 30, 1968 | Japan | 43-62206 |
| Oct. 1, 1968 | Japan | 43-72072 |
| Oct. 1, 1968 | Japan | 43-72073 |
| Oct. 3, 1968 | Japan | 43-72104 |
| Dec. 4, 1968 | Japan | 43-88865 |
| Feb. 21, 1969 | Japan | 44-13099 |

[51] Int. Cl.² .............................. H04B 1/16
[52] U.S. Cl. .................... 325/455; 325/465; 334/15; 358/191; 358/192
[58] Field of Search ............ 325/452, 453, 455, 464, 325/465, 468, 470; 334/14, 15; 178/DIG. 15; 358/191, 192, 194, 193

[56] References Cited

U.S. PATENT DOCUMENTS

| 3,079,462 | 2/1963 | Rosenthal | 178/5.8 |
| 3,287,494 | 11/1966 | Spies et al. | 325/455 |
| 3,443,230 | 5/1969 | Pratt | 325/67 |
| 3,503,018 | 3/1970 | Cavanagh | 334/15 |
| 3,571,720 | 3/1971 | Heagney | 325/390 |
| 3,573,734 | 4/1971 | Williams et al. | 340/168 |
| 3,602,822 | 8/1971 | Evans et al. | 325/464 |

OTHER PUBLICATIONS

Pulse, Digital & Switching Waveforms - Millman & Taub, 1965 pp. 349-352.

Primary Examiner—Robert L. Griffin
Assistant Examiner—Marc E. Bookbinder
Attorney, Agent, or Firm—Stevens, Davis, Miller & Mosher

[57] ABSTRACT

This invention relates to a channel selector provided with a tuning circuit using variable capacitance elements as tuning elements, and has for its primary object the provision of such a channel selector in which bias voltages applied to the variable capacitance elements are preset so that one of these preset bias voltages may be selected by a binary memory circuit and a diode matrix circuit, the selection of the preset voltages disposed in a predetermined sequence may be effected in any desired direction, and one of the bias voltages corresponding to a desired channel may be automatically selected.

8 Claims, 17 Drawing Figures

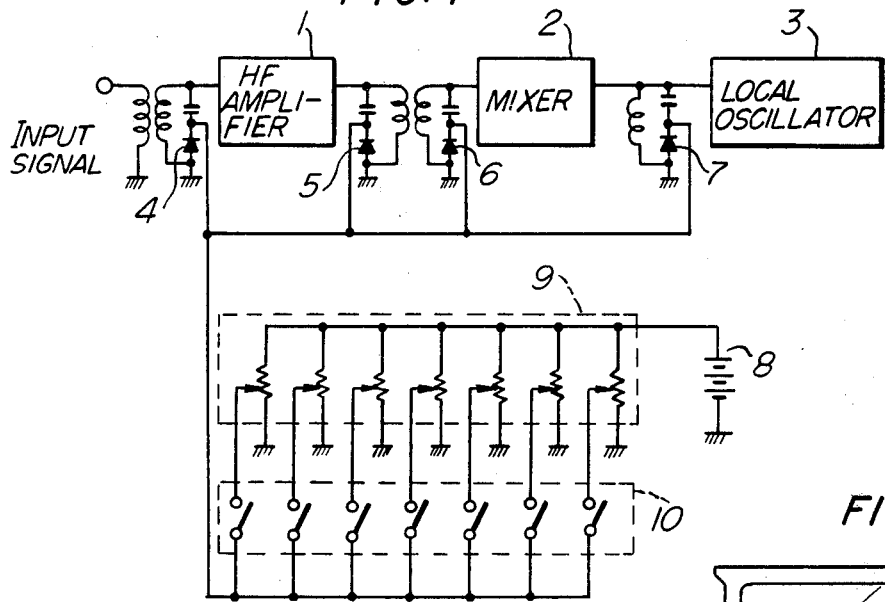
FIG. 1
FIG. 3
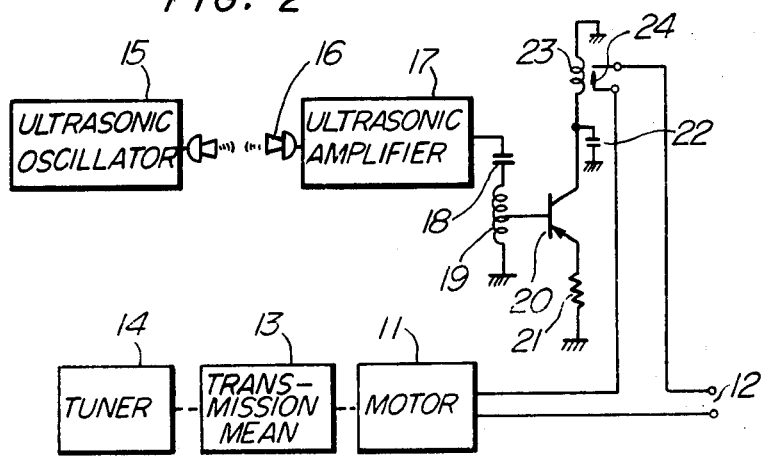
FIG. 2

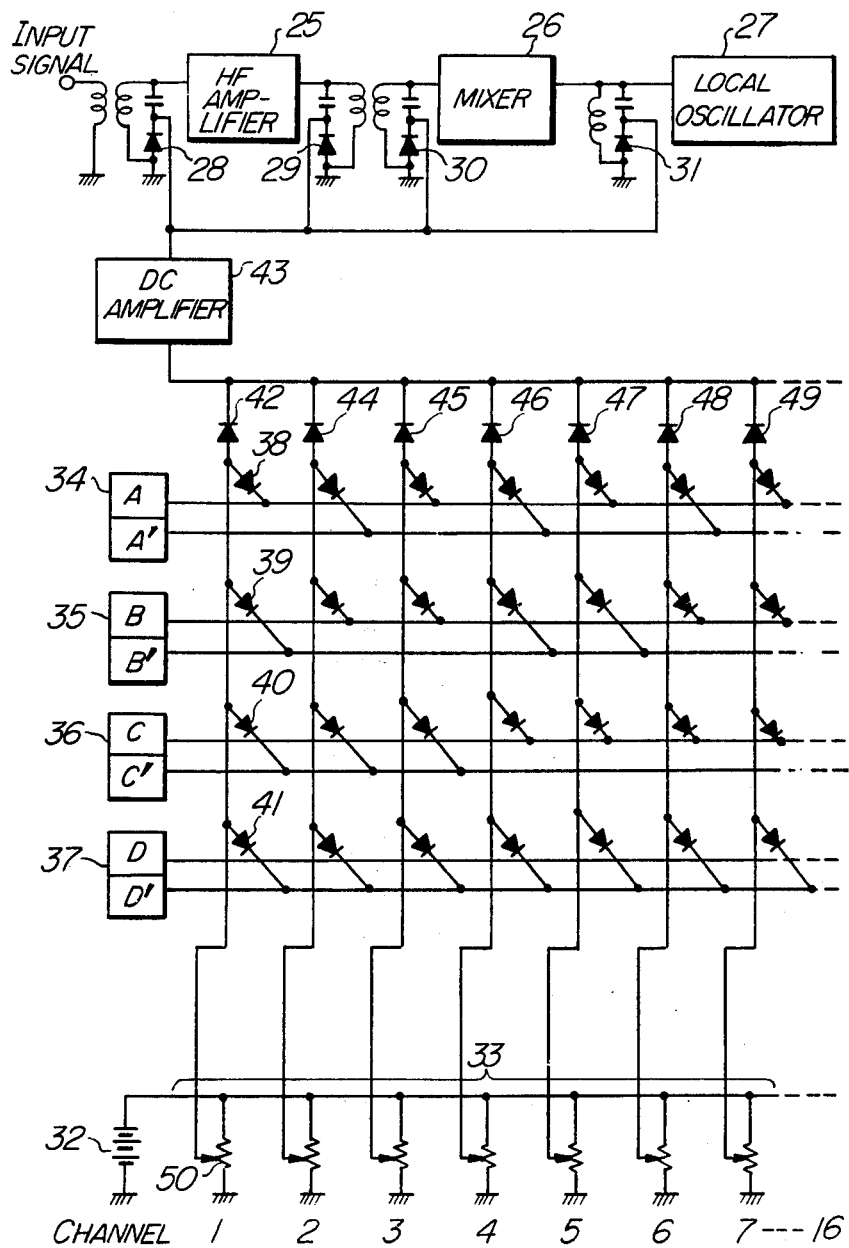

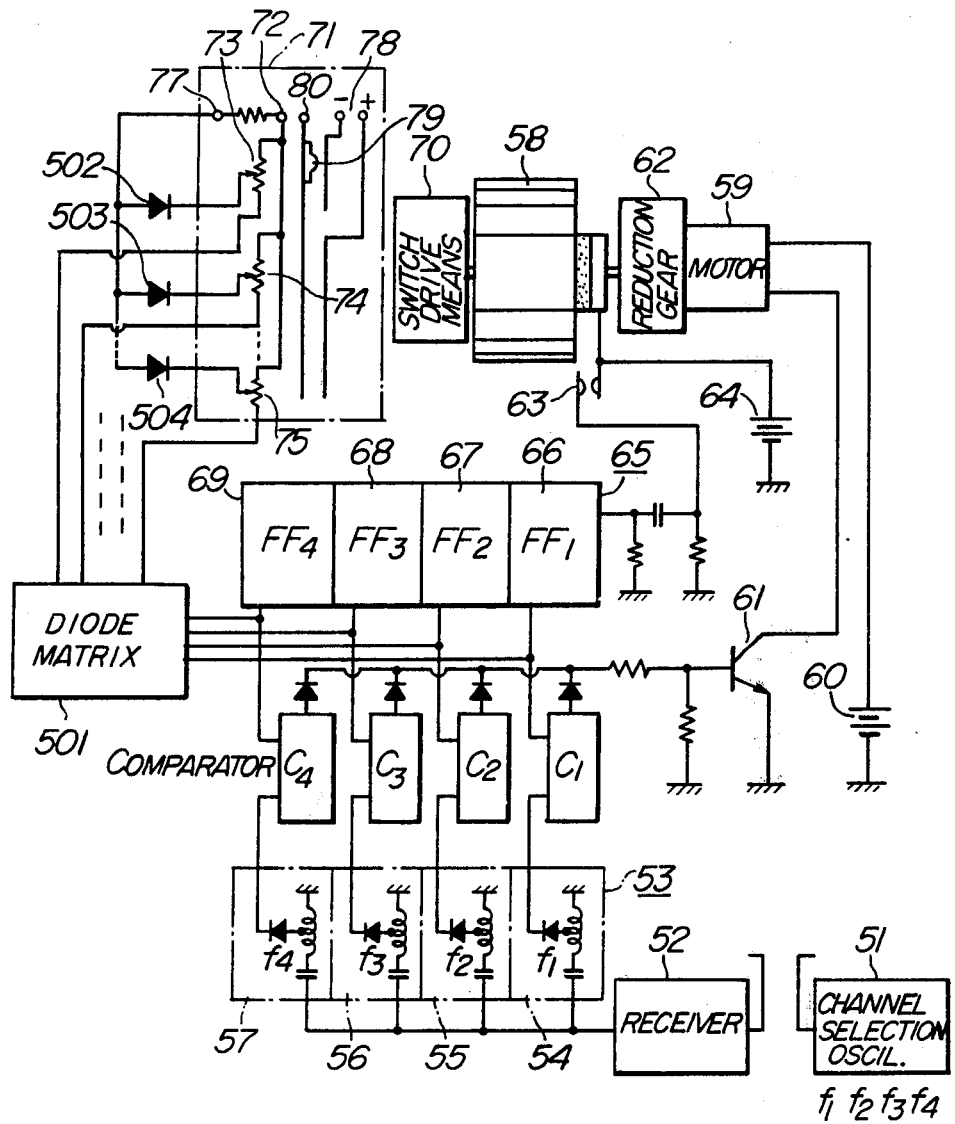

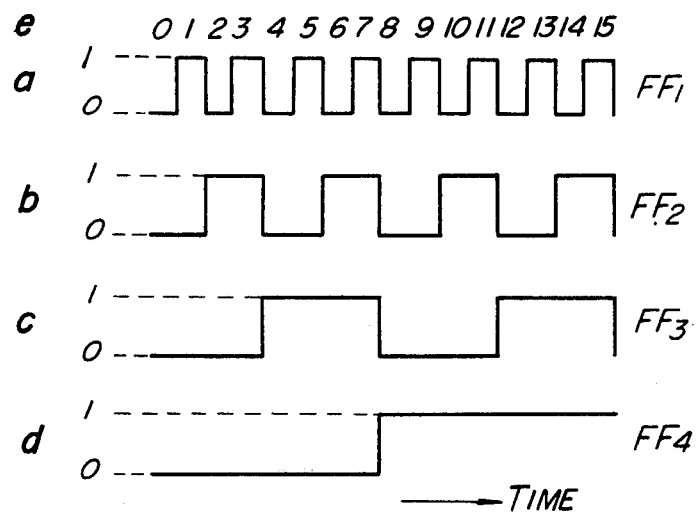
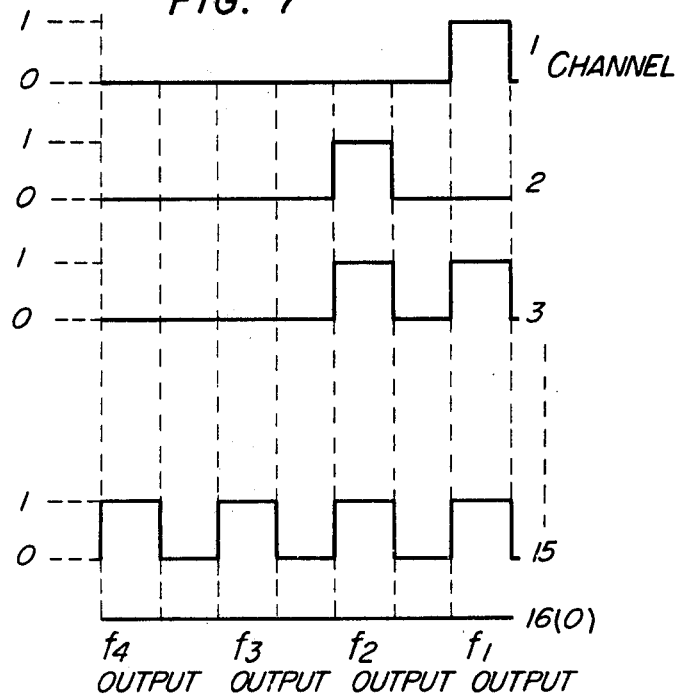

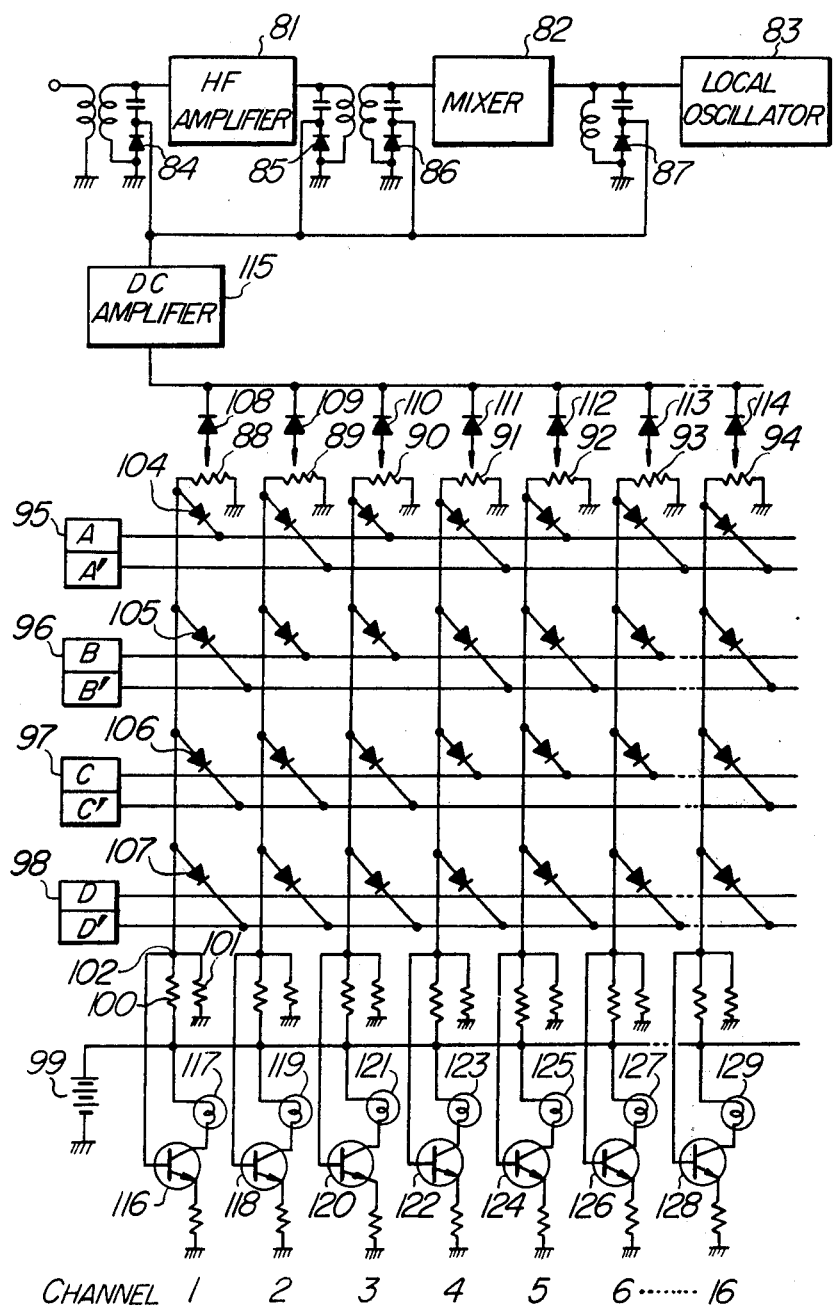

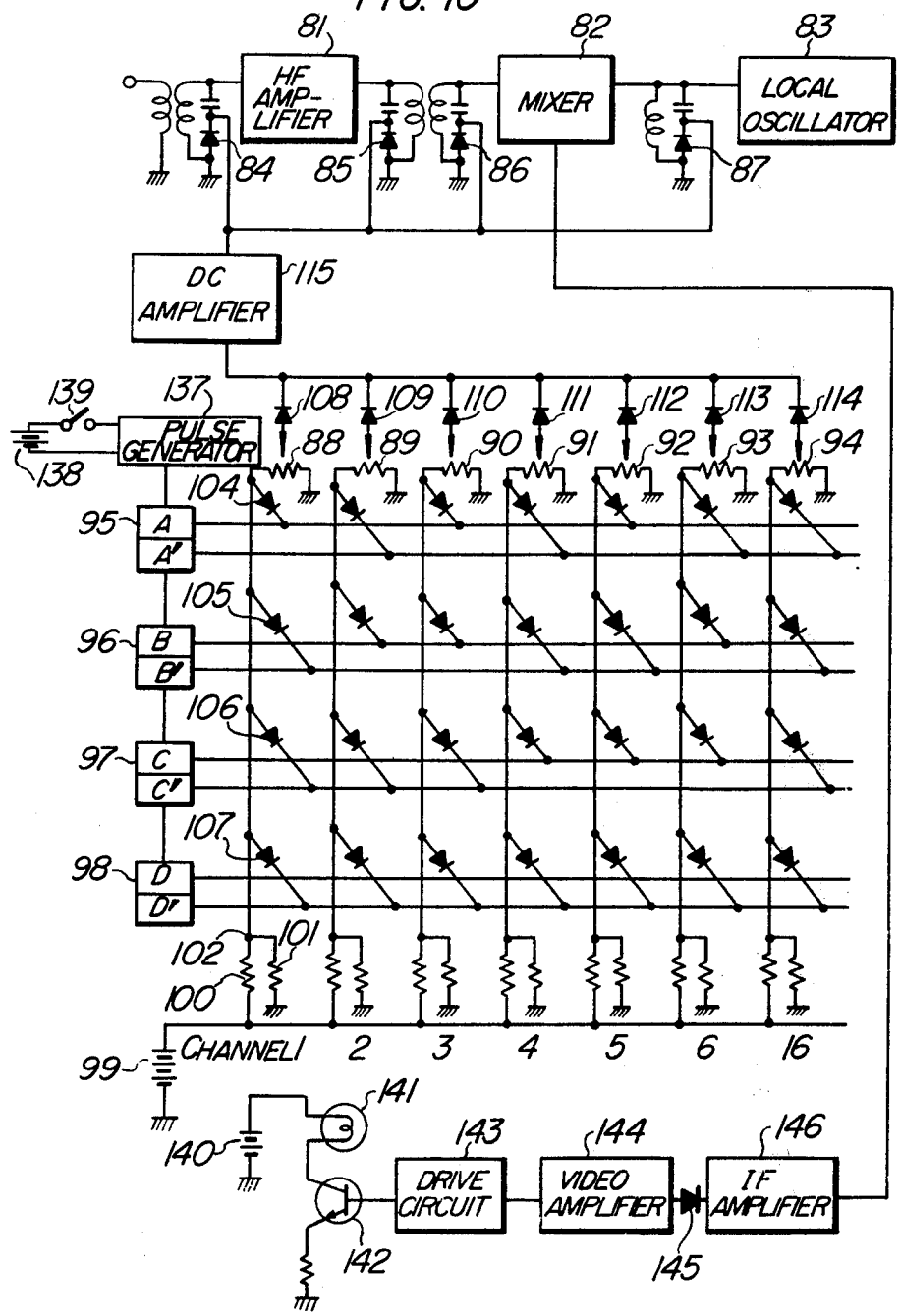

CHANNEL SELECTOR EMPLOYING VARIABLE CAPACITANCE ELEMENTS FOR TUNING

This is a continuation of Ser. No. 194,998, filed Nov. 2, 1971, now abandoned, which in turn was a continuation of Ser. No. 853,165, filed Aug. 26, 1969, now abandoned.

This invention relates to a tuning circuit in which variable capacitance diodes are used as tuning elements and voltages applied thereto are present so that a desired voltage may be selected by an electronic circuit to thereby enable a channel selection control voltage to be applied without using contacts and facilitate the remote-controlled channel selection in television receivers and the like.

The present invention will be clarified from the following description taken in conjunction with the accompanying drawings, in which:

FIG. 1 is a block diagram showing the electrical circuit of the channel selector according to the prior art;

FIG. 2 is a block diagram showing the electrical circuit of the remote-controlled channel selector according to the prior art;

FIG. 3 is a front view of the color television receiver provided with a Braun tube having monitor means according to the prior art;

FIG. 4 is a diagram showing the electrical circuit of the channel selector according to an embodiment of the present invention;

FIG. 5 is a similar diagram showing the electric circuit of the channel selector according to another embodiment of the present invention;

FIGS. 6 and 7 illustrate waveforms relating to the operation of the channel selector of FIG. 5;

FIG. 8 is a diagram showing a circuit similar to that shown in FIG. 4 but additionally having an indicator circuit for indicating a selected channel;

FIG. 10 shows the electrical circuit of the television receiver shown in FIG. 9;

Figure 9:
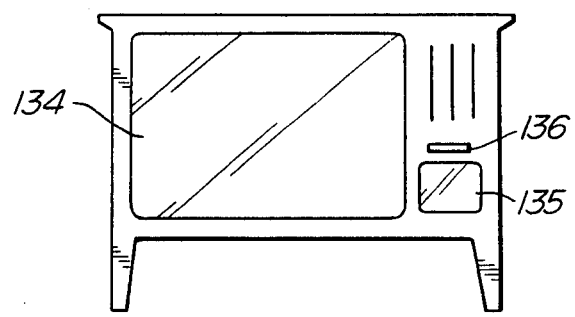
FIG. 9 is a front view of the television receiver provided with means for indicating a color program.

There has heretofore been known a channel selector circuit of a television receiver which uses, for example, variable capacitance diodes as the channel selector. An example of the known channel selector is shown in FIG. 1, which comprises a high frequency amplifier circuit 1, a mixer circuit 2, a local oscillator circuit 3, an input tuning variable capacitance diode 4, interstage tuning variable capacitance diodes 5 and 6, and a local oscillation variable capacitance diode 7. A control source voltage 8 is divided by a group or variable resistors 9, and the proportion at which the source voltage is divided by these resistors 9 applying voltage to the aforementioned variable capacitance diodes is preset so that a suitable voltage may be supplied to receive a desired channel. By closing one of the switches 10 corresponding to a channel to be selected, a preset voltage is applied to the variable capacitance diodes 4, 5, 6 and 7 to enable the channel to be selected. In this case, the presence of the group of switches 10 which must be mechanically actuated means the presence of switch contacts, although such contacts can be eliminated in the tuner body itself by employing variable capacitance diodes as the tuning elements. The provision of mechanically actuated switch contacts prevents the electrically operable channel selector from performing its unique function to the fullest extent. For example, when it is desired to effect the channel selection by a remote control system, great difficulty is encountered in mechanically actuating the switches, and if this is possible at all, it is expensive and leaves the problem that satisfactory change-over of the switch contacts can hardly be ensured.

Also, in the remote-controlled channel selection of a television receiver, it is usually the practice to adopt the sequential channel selecting system as it is called. This system will be described with respect to FIG. 2, which shows an ultrasonic oscillator 15, an ultrasonic microphone 16, and an ultrasonic frequency amplifier 17. A signal amplified by the ultrasonic frequency amplifier 17 is caused to resonate by a resonator circuit comprising a capacitor 18 and a winding 19, an a.c. signal being applied from its intermediate tap to the base of a transistor 20. On the other hand, the emitter of the transistor 20 is connected with the grounded end of the winding 19 through a resistor 21 so that the a.c. signal is applied between the emitter and base of the transistor 20. Thus, the signal is detected by the diode effect between the emitter and base of the transistor 20, and an amplified output in the form of a pulsating current is obtained from the collector of the transistor 20. This pulsating output is smoothed by a parallel circuit of capacitor 22 and relay coil 23 and a dc voltage appears across the relay coil 23. When the dc voltage reaches a value sufficient large to drive the relay, the relay operates to close a contact 24 and thereby a tuner driving motor 11 is connected with a power source through terminal 12 so as to be driven for rotation. The rotation of the motor 11 is transmitted to a tuner 14 through transmission means 13, whereby the tuner is driven to effect the channel selection. If it is desired to change over the received channel from one to another, the change-over may be accomplished by causing the ultrasonic oscillator 15 to produce an ultrasonic signal and changing over the turret switch of the tuner 14 through the operation described above. Such an operation is continued until the desired channel is reached. This is what has been referred to as a "sequential channel selecting system", and such a system is disadvantageous in that considerable time and complicated steps are required before the desired channel can be obtained.

Furthermore, the color television receiver according to the prior art is provided, for example, with three small-diametered monitor Braun tubes 131, 132 and 133 disposed beneath a large-diametered main picture tube 130, as shown in FIG. 3. Such monitor Braun tubes 131, 132 and 133 are utilized to observe telecasts of stations other than the station having its telecast displayed on the screen of the main Braun tube 130. This is only a construction in which three Braun tubes are put together in a single television receiver, and it is expensive to manufacture and complicated in construction. Such a construction also involves mechanically operated parts which introduce problems concerning the accuracy of operation and length of life.

It is therefore an object of the present invention to provide a channel selector which uses no mechanical system but which operates with high reliability.

It is another object of the present invention to provide a channel selector by which a number of channels may be selected sequentially or a desired one of the channels may be selected by skipping over one or more undesired channels which may intervene before the desired channel is reached.

It is still another object of the present invention to provide a channel selector in which, if there are sixteen channels from channel 1 to channel 16, it is possible to select a channel from channel 1 to channel 16 in either direction.

It is yet another object of the present invention to provide a channel selector which is adapted, upon channel selection, to indicate whether the selected channel is presenting a color program or not, and which is remotely controllable.

It is yet still another object of the present invention to provide a channel selector whose circuit may readily be integrated.

These and other objects and features of the present invention will be fully understood by reading the following description taken with respect to the preferred embodiments thereof.

Referring now to FIG. 4, there is shown the electrical circuit of the channel selector according to an embodiment of the present invention, which comprises a high frequency amplifier circuit 25, a mixer circuit 26, a local oscillator circuit 27, an input tuning variable capacitance diode 28, interstage tuning variable capacitance diodes 29 and 30, and a local oscillation variable capacitance diode 31. A control source voltage 32 is divided by a group of variable resistors 33. Description will now be made of the manner in which only a desired one of the voltages obtained by the aforementioned voltage division is selected and applied to the variable capacitance diodes 28, 29, 30 and 31. Numerals 34, 35, 36 and 37 denote flip-flop circuits, for example, and these circuits store the information 1 or 0. A and A', B and B', C and C', and D and D' can produce signals opposite to each other. For the convenience of description, it is assumed that the information corresponding to 1 causes A and A' to produce voltages of 6 volts and 0 volt respectively, while the information corresponding to 0 causes A and A' to produce voltages of 0 volt and 6 volts respectively. This also holds true with B and B', C and C', and D and D'. Assume that the voltage divided from the source voltage by the variable resistor corresponding to channel 1 is $E_1(V)$. Since the source voltage 32 is below 6 volts, the divided voltage does not exceed 6 volts. If the channel indications corresponding to channels 1 to 16 are as shown in Table 1 below, the indication by binary notation corresponding to the channel 1 will be: 1 for AA', and 0 for BB', CC' and DD'. This means that a voltage of 6 volts is produced in each of A, B', C' and D' and diodes 38, 39, 40 and 41 having one end thereof connected with channel 1 are rendered non-conductive. As a result, the voltage $E_1(V)$ divided from the source voltage by the variable resistor 50 is applied to a.d.c. amplifier 43 through a diode 42, and the voltage amplified by the d.c. amplifier 43 is applied to the variable capacitance diodes 28, 29, 30 and 31 of the tuner. At this time, at least one of the diodes connected with the lines of channels 2 to 16 has the cathode thereof brought to 0 volt, and therefore each of these lines is also brought into 0 volt without fail. Since the anode of each diode 44 to 49 is also at 0 volt, these diodes are rendered non-conductive, and after all, the diode 42 alone is rendered conductive.

Table 1

| Channel indication | AA' | BB' | CC' | DD' |
|---|---|---|---|---|
| 1 | 1 | 0 | 0 | 0 |
| 2 | 0 | 1 | 0 | 0 |
| 3 | 1 | 1 | 0 | 0 |
| 4 | 0 | 0 | 1 | 0 |
| 5 | 1 | 0 | 1 | 0 |
| 6 | 0 | 1 | 1 | 0 |
| 7 | 1 | 1 | 1 | 0 |
| 8 | 0 | 0 | 0 | 1 |
| 9 | 1 | 0 | 0 | 1 |
| 10 | 0 | 1 | 0 | 1 |
| 11 | 1 | 1 | 0 | 1 |
| 12 | 0 | 0 | 1 | 1 |
| 13 | 1 | 0 | 1 | 1 |
| 14 | 0 | 1 | 1 | 1 |
| 15 | 1 | 1 | 1 | 1 |
| 16 | 0 | 0 | 0 | 0 |

If the voltage amplified by the d.c. amplifier 43 is a voltage which enables the variable capacitance diodes 28 to 31 to acquire a suitable capacitance to receive a desired channel, then it means that channel 1 has been selected. Similarly, any one of channels 2 to 16 may be selected as desired, in the manner described with respect to FIG. 3 and Table 1. Of course, the number of the channels which can be selected may vary with the number of the flip-flops such as AA' to DD'. The group of diodes represented by numerals 38 to 41 is hereinafter referred to as a "diode matrix".

According to this embodiment of the present invention, as described above variable capacitance diodes are employed as the tuning elements. The voltages controlling these diodes are preset and the output terminals for these preset voltages are connected with the columns (or rows) of the diode matrix while a binary memory circuit is connected with the rows (or columns) of the diode matrix, so that information is supplied to the binary memory circuit to control the tuning condition entirely electronically. Thus, the tuning condition can be varied without using any mechanical system and the channel selector of the present invention assures highly reliable operation and a long life.

FIG. 5 shows another embodiment of the present invention, and its operating waveforms are illustrated in FIGS. 6 and 7. In FIG. 5, a signal comprising a plurality of frequencies $f_1$, $f_2$, $f_3$ and $f_4$ oscillated by a channel selection controlling oscillator 51 is received and amplified by a receiver 52 and imparted to a group of tuning circuits 53. Numerals 54 to 57 denote circuits resonating to the respective frequencies $f_1$, $f_2$, $f_3$ and $f_4$ and detecting their d.c. resonance signals. A motor 59 connected with a power source 60 transmits its rotation to a numerical indicating dial 58 through a reduction gearing 62. Each time a different numeral is indicated on the dial, a switch 63 is opened and closed to interrupt the voltage from a power source 64. The pulse thus produced is applied to a group of flip-flops 65 comprising flip-flops $FF_1(66)$, $FF_2(67)$, $FF_3(68)$ and $FF_4(69)$. The output pulse of the flip-flop 66 operates the succeeding flip-flops 67 through 69 in succession. The outputs of the respective flip-flops are represented by $a$, $b$, $c$ and $d$ in FIG. 6, and these outputs are applied to comparators $C_1$, $C_2$, $C_3$ and $C_4$ respectively. In FIG. 6, if the horizontal axis represents time, the numerals indicated on the numerical indicating dial 58 vary as shown in e on the top of the Figure. If the numerals indicated on the dial are meant to indicate tuned channels, the combination of the outputs of the flip-flops corresponding to these numerals will be as shown in Table 1.

Referring now to FIG. 7, there is shown a combination of the d.c. outputs of the tuning circuit group 53. If during the rotation of the motor all the outputs of comparators $C_1$, $C_2$, $C_3$ and $C_4$ are made equal to the ground potential when the combination of the outputs from the tuning circuit group 53 for a channel is in accord with the combination of the outputs from the flip-flop group 65, then transistor 61 inserted in the motor circuit is cut off to stop the motor from rotating and the channel number corresponding to the combination of the tuning circuits is indicated on the numerical indicating dial. A switch drive means 70 has a function as shown within a frame 71. Numeral 72 denotes a terminal for the constant source voltage applied to the variable capacitance diodes constituting the tuning element of the tuner. Numerals 73, 74 and 75 represent variable resistors for presetting the voltage applied to the said variable capacitance diodes, 77 a terminal connected with the variable capacitance diode circuit of the tuner, 78 a power source terminal for applying voltage to the switching diode to select between the high and low VHF bands of the tuner, 79 a band change-over switch, and 80 a terminal for the connection with the band change-over terminal of the tuner. FIG. 5 shows the case where the high or low VHF band is selected, but a switching circuit for VHF band may be additionally provided in the illustrated embodiment. The outputs from the flip-flops 66–69 select the particular variable resistors 73–75 through diode matrix 501 and imparts a suitable bias to the variable capacitance elements through the terminal 77. Numerals 501 to 504 denote switching diodes which operate similarly to diodes 108 to 114 which will be described and shown in FIG. 8.

While the foregoing description has been made of the case where use is made of four sets of flip-flop and tuning circuit or the case where the number of available channels is 16, the number of sets of flip-flop and tuning circuit may be increased. For example, if the number of the sets is increased to 5 the number of available channels will become 32, and if the number of the sets is increased to 6, the number of available channels will become 64. This relation can be expressed thus: if $n$ is the number of control signals, the number of channels will be $2^n$. If it is desired to obtain any number of channels between the said range of channels, the indication of the channel numbers may be omitted for any possible excess channels or the number of channels may be decreased by providing a feedback circuit within the flip-flop group. In the embodiment described above, channel selection can be accomplished on the spot simply by depressing a button carrying a desired channel number thereon. Therefore, the time and trouble required for the channel selection are not so great as in the conventional sequential channel selecting system. It is also psosible to select a considerable number of channels even if the number of flip-flops and the number of oscillation frequencies are small. Since the number of channels controllable by a set of $n$ control signals is $2^n$, the channel selector according to this embodiment is able to select any desired channel out of many channels and is very economical to manufacture.

A further embodiment of the present invention shown in FIG. 8 is fundamentally the same as that shown in FIG. 4. This alternative embodiment includes a high frequency amplifier circuit 81, a mixer circuit 82, a local osicllator circuit 83, an input tuning variable capacitance diode 94, interstage tuning variable capacitance diodes 85 and 86, and a local oscillating variable capacitance diode 87. Variable resistors 88 to 94 are provided to preset the voltages applied to the variable capacitance diodes 84 to 87 of the tuner with respect to the respective channels. Circuits 95 to 98 are constituted by flip-flops and these circuits store the information 1 or 0. A and A′, B and B′, C and C′, and D and D′ can produce opposite signals to each other. For the sake of this description, it is assumed that the information corresponding to 1 causes A and A′ to produce voltages of 9 volts and 0 volt respectively while the information corresponding to 0 causes A and A′ to produce voltages of 0 volt and 9 volts respectively. This also holds true with B and B′, C and C′, and D and D′. Description will now turn to what output signals must be produced from the flip-flop group in order that the voltage applied to the variable resistor 88 corresponding to channel 1 may be divided from a source voltage 99 by resistors 100 and 101 and may appear at a connection point 102. In Table 1, the binary-coded indication corresponding to channel 1 is 1 for AA′, and 0 for the rest. This means that a voltage of 9 volts is produced in each of A, B′, C′ and D′ and diodes 104 to 107 having one end thereof connected with the row of channel 1 become non-conductive. In this case, however, it is assumed that the voltage at the connection point 102 does not exceed 9 volts but that it is 6 volts for the convenience of description. If a voltage of 6 volts is produced at the connection point 102 this voltage of 6 volts will be applied across the variable resistor 88, and therefore the divided voltages are applied to the variable capacitance diodes 84, 85, 86 and 87 through diodes 108 and d.c. amplifier 115. At this point, at least one of the diodes connected with the respective columns in the rows corresponding to channels 2 to 16 has the cathode thereof brought into 0 volt, and thereby the lines represented by the respective columns will assume 0 volt without fail. As a result, the anodes of the diodes 109 to 114 also assume 0 volt, thus rendering these diodes non-conductive, so only the diode 108 is rendered conductive. If the voltage applied by the amplifier 115 is sufficiently high enough to enable the variable capacitance diodes 84 to 87 to obtain a suitable capacitance to receive a desired channel, then it will be possible to select it. In the same way, the information corresponding to each channel indication in Table 1 may be applied to flip-flops 95 to 98 of FIG. 8 to thereby select one of the channels 2 to 16 as desired. Of course, the number of the channels which can be selected may vary with the number of the flip-flops in use. The diode groups represented by numerals 104 to 107 are referred to as the "diode matrix".

In order to indicate the channel number or name of the channel selected, if that channel is channel 1, a transistor 116 may be switched on by the voltage appearing at the connection point 102 to thereby turn on a pilot lamp 117. This is also the case with the other channels 2 to 16, that is, one of transistors 118, 120, 122, 124, 126 and 128 is switched on in accordance with the channel number selected, and thereby one of pilot lamps 119, 121, 123, 125, 127 and 129 connected with the collectors of the said transistors is turned on. It is of course possible to replace these pilot lamps by such indicator means as neon lamps, decatrons or the like and to use circuits suited to such indicator means so as to effect the channel indication.

According to this embodiment, as discussed above, variable capacitance elements are employed as the tuning elements, their control voltages are preset, one of the preset voltages is selected by the diode matrix circuit controlled by a signal from the binary memory circuit, and the bias voltages of the variable capacitance elements are varied, whereby the tuning condition can be controlled entirely electronically. Also, the channel indicator circuit may be operated by the aforementioned bias voltages so as to indicate the received channels. Furthermore, the channel selection can be accomplished without using any mechanical system and this results in the reliable operation and long life of the channel selector. In addition, remote control of the channel selection, if desired, may be achieved simply by providing a variable pulse train of the binary memory circuit, which leads to a greater speed and increased reliability of the operation than in the case of a prior art channel selector which incorporates a mechanical system.

Further, the above-described circuit in which variable capacitance elements are employed as the tuning elements, the bias voltages thereof being selected through a diode matrix connected with a voltage source by controlling said matrix with a signal from a binary memory circuit so that said sources voltage is divided according to a predetermined scheme, has an additional advantage over the circuit as shown in FIG. 4 in that the circuit design is easy because the operating points of the diodes are constant regardless of the preset bias voltage, as an identical voltage is applied to all of the diodes in the matrix. Moreover, channel selection as well as channel indication can be accomplished automatically and easily according to the circuit shown in FIG. 8.

Figure 11:
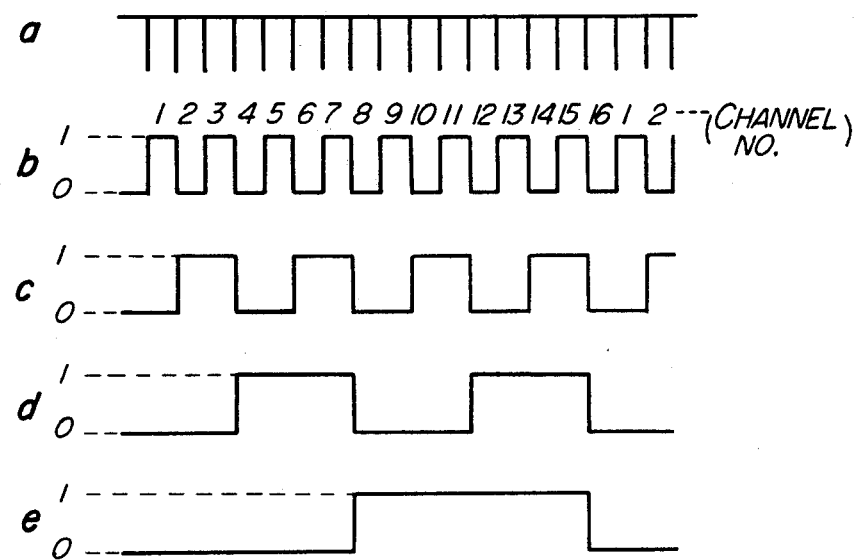
FIG. 11 illustrates waveforms relating to the operation of the circuit shown in FIG. 10.

Turning to FIGS. 9 and 10, there is shown a further embodiment of the present invention, FIG. 9 being a front view of the television set incorporating such a circuit as shown in FIG. 10. The monitor Braun tube 135 is provided to observe telecasts of stations other than the station having its telecast viewed on the screen of the main tube 134. The circuit arrangement of FIG. 10 is substantially the same as that of FIG. 8 and like parts are indicated by like numerals, and so the description of their operation is omitted herein. In FIG. 9, numeral 134 denotes a main picture tube, 135 a monitor Braun tube, and 136 a color telecast indicator. An explanation is made with respect to the flip-flop circuit group of FIG. 10 for automatically switching over the channels, which switch-over operation is different from the operation of the circuit of FIG. 8. In FIG. 10, there are provided a pulse generator circuit 137 such as an astable multivibrator or the like, a power source 138 for the pulse generator circuit 137, and a switch 139 closing when the pulse generator circuit 137 is desired to operate. The pulse generator circuit 137 generates pulses in time sequence. The output pulses of the pulse generator circuit 137 trigger the flip-flop circuit 95 to continuously change between its binary states, and the resulting binary 1 outputs of the flip-flop circuit 95 trigger the flip-flop circuit 96 to sequentially change between its binary states. The binary 1 outputs of the flip-flop circuit 96 and those resulting in the same manner from the flip-flop circuit 97 trigger the respective succeeding flip-flop circuits 97 and 98 to change between the respective binary states. One arrangement of the pulse sequences of the pulse generator and these flip-flop circuits is next mentioned. FIG. 11 illustrates the relation with the output of the pulse generator circuit. If a pulse train (a) as shown in FIG. 11 is produced by the pulse generator circuit 137, the flip-flop circuit 96 produces an output as shown by (c). Further, the flip-flop circuits 97 and 98 produce output pulses as shown by (d) and (e). The combinations of the presence or absence of the output pulses of all the flip-flop circuits 95 to 98 at the same time respectively form the codes for the channels to be selected, as shown in FIG. 11. Accordingly, in FIG. 11, stating the relationship between the channel numbers and the combinations of the binary 1 or 0 outputs of the flip-flop circuits, e.g., the pulse trains (b) to (e), the channel number 1 is represented by the combination of 1, 0, 0, 0 outputs of the pulse trains (b) to (e) respectively; and the channel number 2 by the combination of 0, 1, 0, 0 outputs; and so on. Namely, these combinations correspond to the binary-coded indication of the channel numbers shown in Table 1 mentioned before. The received channel is changed over from one to another successively in this manner. The channel code formed by the flip-flop counting chain 95 to 98 may be held by interrupting the supply of the pulse train from the pulse generator 137 to the flip-flop circuit 95 by opening the switch 139. The simplest means for opening the switch 139 for a desired channel code may depend upon the provision of the pulse generator 137 with a moderately long pulse generating period and the manual opening operation of the switch on receipt of the desired channel. Alternately, another interrupting means may be applied to the pulse generator 137; that is, the means similar to the system described with reference to FIG. 7 in connection with the embodiment of FIG. 5. But if the channel selected is telecasting, intermediate frequency outputs from the mixer circuit 82 will be detected by a detector 145 through an intermediate frequency amplifier 146. Out of the video signals detected, the color sub-carrier signal passes through a video and band amplifier 144 to operate a drive circuit 143 so that a sufficiently large voltage to actuate a transistor 142 is supplied during the color telecast reception, and that a voltage to switch off the transistor 142 is supplied when the color telecast is interrupted. In response to such switching on and off of the transistor 142, a pilot lamp 141 can be turned on and off by a voltage source 140. In practical television sets, the main Braun tube 134 and the monitor Braun tube 135 may be provided with respective selection circuits such as shown in FIG. 10 so that they are individually switched over the channels, for example, in such a manner that with respect to the selection circuit for the monitor, the pulse generator 137 of FIG. 10 is set to generate a pulse train of a moderately long repetition period and the switch 139 is operated to make its contacts close to select or observe the telecasts of the channels sequentially in time by the indication of the monitor Braun tube 135 and the color telecast indicator 136, irrespective of the display circuit of the main screen.

Thus, according to the present embodiment, addition is made of a selector for selecting the matrix circuits through a relay circuit driven by $n$ signals and controlling the circuit for binary-coding the $n$ signals, and a color telecast reception indicating circuit, to the picture tube circuit of the monitor picture tube, whereby the received channel may be changed over in succession simply by closing the switch of the selector and the indicator circuit may be operated during the color telecast. In this way, the channel selector according to the present embodiment not only enables the type of telecast to be readily checked by the viewer, but also facilitates the remote control because the operation can be attained simply by actuating the selector switch.

Figure 12:
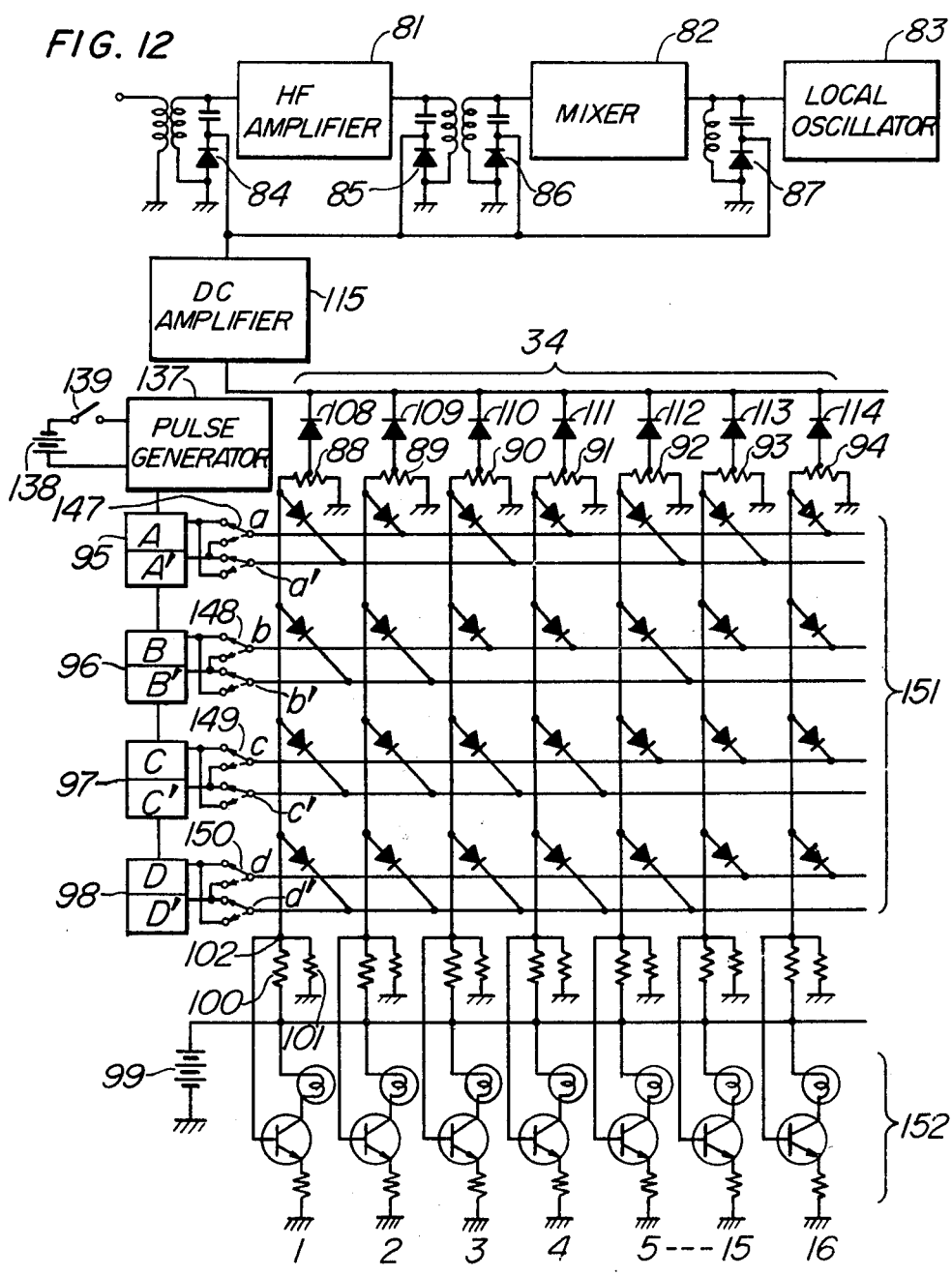
FIG. 12 is a diagram showing the electrical circuit of a channel selector similar to that shown in FIG. 8 but adapted to effect reversible channel selection.
Figure 13:
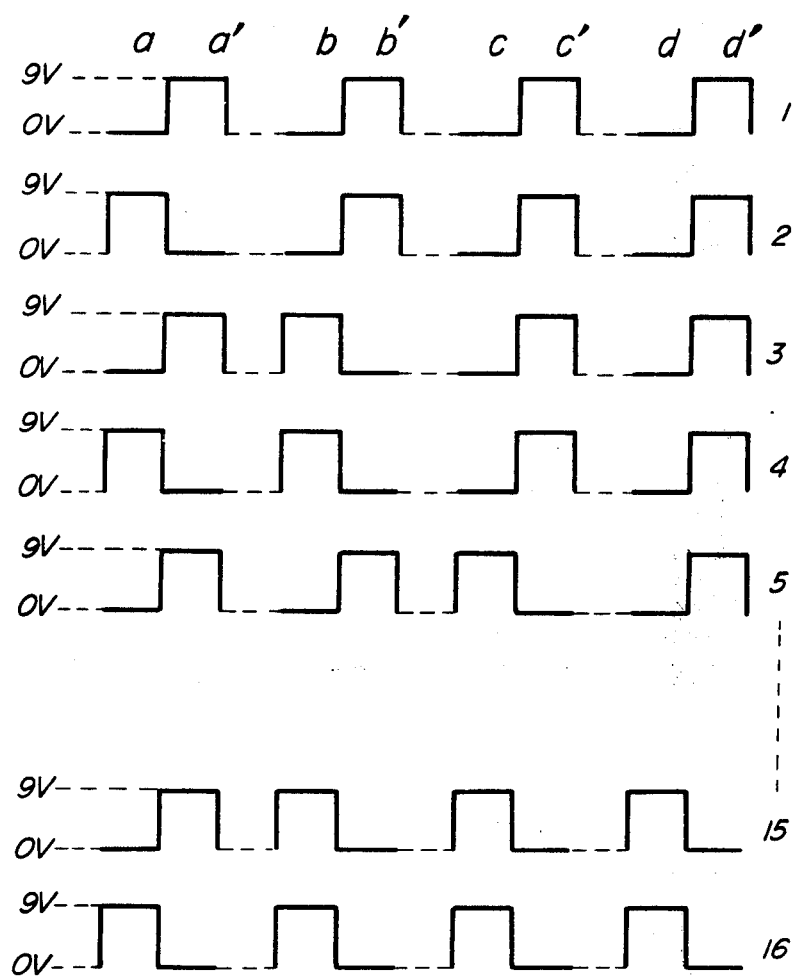
FIGS. 13 and 14 illustrate waveforms relating to the operation of the circuit of FIG. 12.
Figure 14:
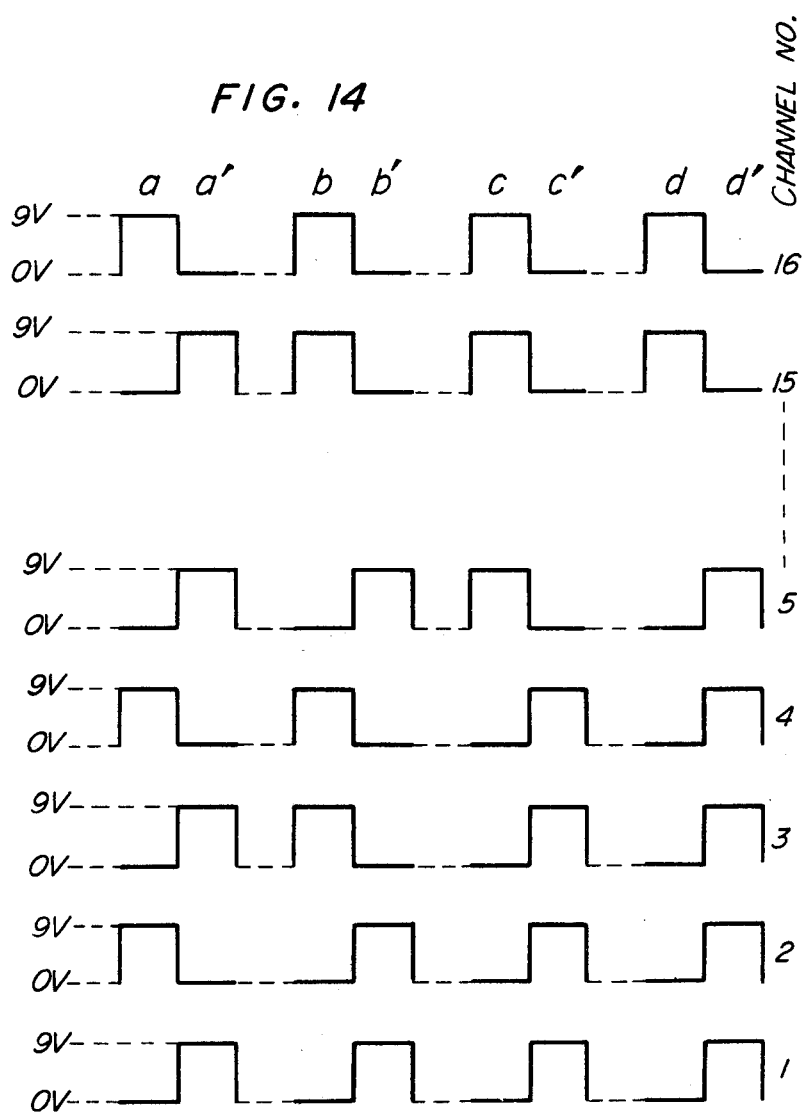

Referring to FIG. 12, there is shown a still further embodiment of the present invention which is substantially the same in construction as the embodiments shown in FIGS. 8 and 10. In FIG. 12, like parts are indicated by like numerals and description of their operation is omitted herein. When switches 147 to 150 and terminals $a,a'$ to $d,d'$ are connected together as shown by the solid lines, signals as shown in FIG. 13 are applied to a matrix 151 which is thus brought into the same state as shown in FIG. 10, so as to successively select the channels in the direction from channel 1 to channel 16. If switches 147 to 150 and terminals $a,a'$ to $d,d'$ are connected together as shown by the dotted lines, signals as shown in FIG. 14 are applied to the matrix 151 without varying the sequence of operation of memory circuits 95, 96, 97 and 98, so that the channel selection is effected in the opposite direction, i.e. from channel 16 to channel 1. In practical television sets, the main Braun tube 134 and the monitor Braun tube 135 may be provided with the respective selection circuits such as shown in FIG. 12 in lieu of the circuit of FIG. 10 for the purpose of effecting the individual selections.

Figure 15:
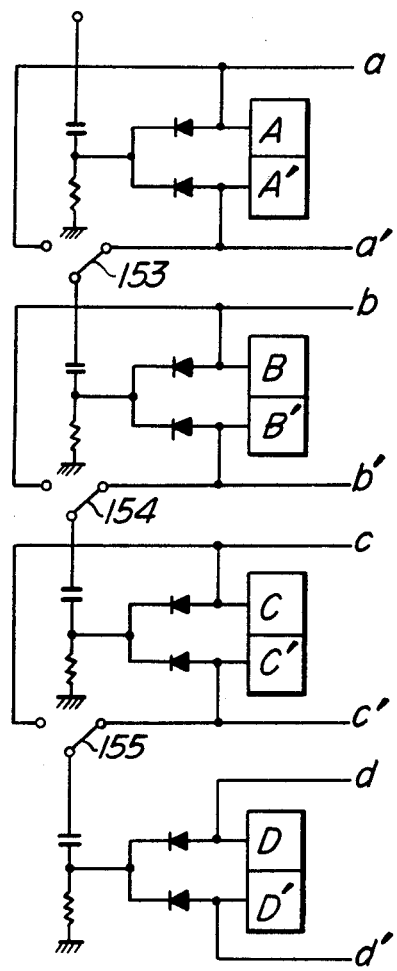
FIG. 15 is a schematic diagram showing the electrical circuit of the reversible channel selector according to another embodiment of the present invention.

FIG. 15 shows a modification of the FIG. 12 embodiment, in which A,A'; B,B'; C,C'; and D,D' correspond to the flip-flop 95 to 98 of FIG. 12 and $a,a'$; $b,b'$; $c,c'$ and $d,d'$ represent the columns of the matrix. By changing over switches 153, 154, and 155 there is attained the same operation as described with respect to FIG. 12 and channel selection in the opposite directions becomes possible.

Needless to say, the number of channels to be selected may be varied by varying the number of stages of the counter circuit or by applying negative feedback. Also, the matrix circuit used in the illustrated example is a diode matrix, whereas it is not limited thereto but use may be made of any matrix that converts binary codes into a scale of n codes. In FIG. 12, the lamp group 152 is directed to the channel indication and these lamps may be indicator means such as neon lamps or the like.

As has been discussed above, according to this embodiment the channel selector using variable capacitance diodes as the tuning elements employs electronic circuits not only for the tuning circuit per se but also for the circuit controlling the tuning circuit, thereby enabling the channel selection to be accomplished entirely electronically without any trouble caused in the mechanism, and further enabling the selection of the channels to be effected in opposite directions without the need to use any special means for this purpose. Thus, the channel selector according to this embodiment may be especially applicable to color television receivers to effect the selection with greater ease.

Figure 16:
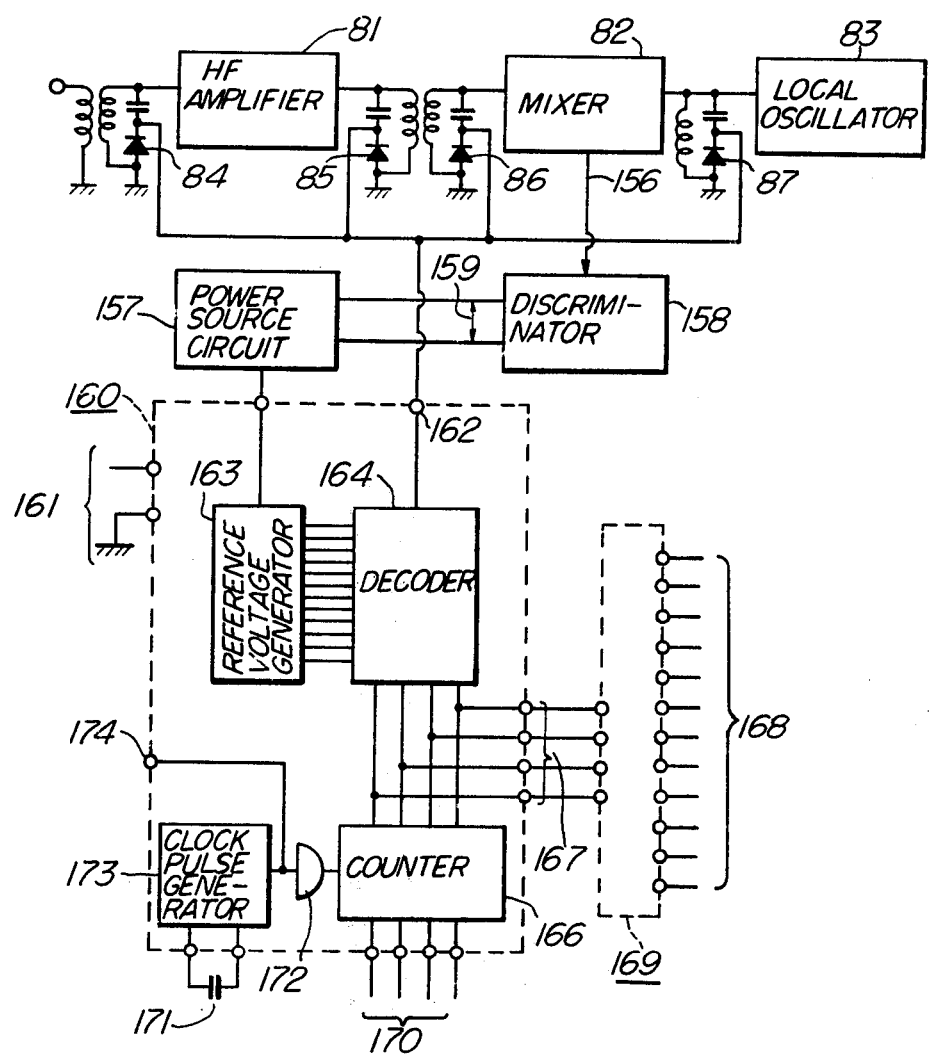
FIG. 16 is a block diagram showing the integrated electrical circuit of the channel selector according to an embodiment of the present invention.

FIG. 16 shows an example of the channel selector of the foregoing embodiments in which the circuit is arranged so as to be readily integrated. In FIG. 16, the parts indicated by 81 to 87 correspond to those indicated by like numerals in FIGS. 8 and 10. Numeral 158 denotes a frequency discriminator circuit for effecting AFC, 159 the output voltage of the discriminator circuit 158, and 157 a power source circuit whose output voltage is controlled by the voltae 159. Numeral 160 represents an integrated circuit incorporated in the tuner, the integrated circuit 160 including therein reference voltage generator circuits 163 corresponding to the channels, a decoder 164 for selecting a desired channel from the circuits 163 in accordance with a binary code, a counter circuit 166 for generating binary codes which comprises, for example, a plurality of flip-flops connected together to constitute a counter circuit and which defines 1 or 0 by the varying d.c. output to thereby produce binary codes in output portion 165, a clock pulse generator circuit 173 for generating clock pulse applied to the counter circuit 166, a capacitor 171 for adjusting the cycle of clock pulse, and a gate circuit 172 operated by a voltage applied to a terminal 174. A terminal 161 is a power source terminal of the integrated circuit 160, and a terminal 170 is one for applying binary-coded signals to the counter circuit 166. A terminal 167 is the output terminal of the counter circuit 166 and this terminal supplies a binary-coded d.c. voltage therethrough to an integrated circuit 169 so as to drive the integrated circuit 169 to take an output for the channel indicator from terminal 168. Further, a terminal 162 is provided to select a desired voltage from a reference voltage generator circuit 163 by means of decoder 164 so that the selected voltage may be applied to a variable capacitance diodes 84 to 87 of the tuner.

Assuming that the coil inductance is L, that the capacitance of the variable capacitance diodes is C, that the distributed capacity in the coil and circuit is $C_o$, and that the received frequency is $f$, then the following relation is established:

$$f = \frac{1}{2\pi\sqrt{L(C + C_o)}}$$

Hence, its logarithmic representation will be:

$$\log f = \log \frac{1}{2\pi} - \frac{1}{2} \log L - \frac{1}{2} \log(C + C_o)$$

Now assuming that the reverse voltage applied to the variable capacitance diodes is $V_R$, that the diffused voltage is $V_d$, and that the constant is K, then the capacitance of the variable capacitance diode will be:

$$C = \frac{K}{\sqrt[n]{V_R + V_d}} \approx KV_R^{-\frac{1}{n}} \quad (V_R >> V_d)$$

Figure 17:
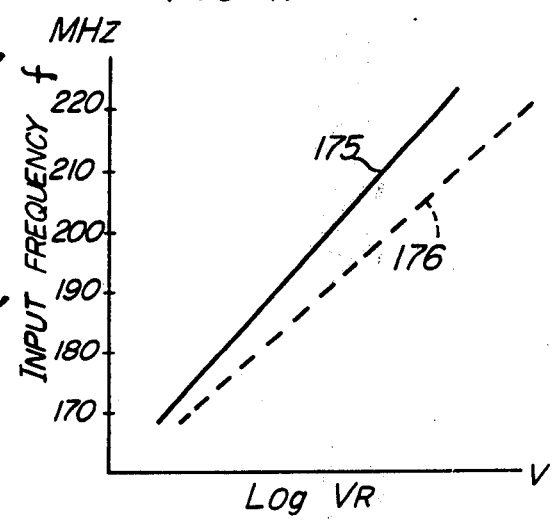
FIG. 17 shows the characteristics of the circuit of FIG. 16.

Hence, $$\log f = \log \frac{1}{2\pi} - \frac{1}{2} \log L - \frac{1}{2} \log (KV_R^{-\frac{1}{n}} + C_o)$$

$$= F(L) - \frac{1}{2} \log (KV_R^{-\frac{1}{n}} + C_o),$$

where F(L) is the function of L. The range of $f$ treated herein is such that $\log f$ is substantially in linear relationship with $f$, and $KC_R^{-1/n}$ is considerably greater than $C_o$. Therefore, if the relation given by the foregoing equation is represented by the vertical axis and the received frequency $f$ by the horizontal axis, then log $V_R$ of the reverse voltage $V_R$ applied to the variable capacitance diodes will be shown as a curve approximate to a straight line as shown in FIG. 17. In this Figure, if a curve 175 shows a desired relationship, a curve 176 representing the unadjusted ordinary relationship may be approximated to the curve 175 in the manner to be described. First, the value of the coil inductance L is varied to approximate the curve 176 to the curve 175. If the slope of the curve 176 is still different from that of the curve 175, then the output of the power source 157 is varied or the distributed capacity $C_o$ is varied by a trimmer condenser or both, so that the slope of the curve 176 may be approximate to that of the curve 175. Actually, the adjustment is made by mounting the integrated circuit 160 before the tuner is adjusted, and thereafter varying the coil inductance and the capacity of the trimmer condenser and, if required, the source voltage of the integrated circuit 160 so as to match the voltage produced by the integrated circuit 160, whereby the desired frequency may be obtained.

As has been described above with respect to the present embodiment, the tuner is of the self-contained type with contains therein a power source for the variable capacitance diodes and a selector circuit, and this eliminates the necessity of employing a group of variable resistors for presetting the applied voltage and a group of switches as required in the prior art, thus resulting in a compact construction. Moreover, the variable elements of the tuner are adjusted to match the output voltage characteristic of the integrated circuit and during the manufacturing process the adjustment of the tuner can be made entirely in the same way as that of the conventional tuner.

What is claimed is:

1. A television receiver channel selector for selecting one from among a plurality of channel tuning frequencies, comprising:
   a tuning circuit tunable to said plurality of channel tuning frequencies, including variable capacitance diodes as tuning elements;
   a plurality of voltage supply circuits for supplying at outputs thereof tuning voltages corresponding to said plurality of channel tuning frequencies;
   binary momery circuit means having a plurality of outputs for producing binary coded information signals corresponding to said channel tuning frequencies, said memory circuit comprising a binary counter circuit having a plurality of complementary pairs of output terminals;
   binary decoder means having a plurality of complementary pairs of input terminals connected to said counter circuit output terminals and a further plurality of terminals coupled to the outputs of said voltage supply circuits;
   means for selectively connecting the outputs of said voltage supply circuits to said variable capacitance diodes for tuning said tuning circuit to one of said channel tuning frequencies, including means selectively connecting the output of one of said voltage supply circuits to said variable capacitance diodes to tune said tuning circuit to the corresponding channel tuning frequency and disconnecting the outputs of all others of said voltage supply circuits from said variable capacitance diodes, the selective connection of said one voltage supply circuit and disconnection of said all other voltage supply circuits being controlled by a given binary decoder means output;
   a pulse generator circuit coupled to an input of said binary counter circuit for supplying pulses in sequence to said counter circuit and switch means for controlling the supply of pulses from said pulse generator to said counter circuit; and
   reversing switch means interposed between each set of corresponding pairs of said input and output terminals of said decoder and counter circuit, respectively, for reversing the connections between said input and output terminals within each set of said corresponding pairs of terminals.

2. A television receiver channel selector for selecting one from among a plurality of channel tuning frequencies, comprising:
   a tuning circuit tunable to said plurality of channel tuning frequencies, including variable capacitance diodes as tuning elements;
   a plurality of preset voltage supply circuits, including preset impedances, for supplying at outputs thereof tuning voltages corresponding to said plurality of channel tuning frequencies;
   binary memory circuit means having a plurality of outputs for producing binary coded information signals indicating pure binary numbers and corresponding to said channel tuning frequencies;
   binary decoder means having a first plurality of terminals coupled to the corresponding outputs of said binary memory circuit means and a second plurality of terminals coupled to the outputs of said voltage supply circuits;
   means for selectively connecting the outputs of said voltage supply circuits to said variable capacitance diodes for tuning said tuning circuit to one of said channel tuning frequencies, including means for selectively connecting the output of one of said voltage supply circuits to said variable capacitance diodes to tune said tuning circuit to the corresponding channel tuning frequency and disconnecting the outputs of all others of said voltage supply circuits from said variable capacitance diodes, the selective connection of one said voltage supply circuit and disconnection of said all other voltage supply circuits being controlled by a signal appearing on a given one of said second plurality of decoder means terminals;
   a plurality of switching elements having control terminals respectively connected to said second plurality of terminals of said binary decoder means, the corresponding one of said switching elements being urged conductive by said signal appearing at said given one of said second plurality of decoder terminals; and
   a plurality of indicating means connected in series with the respective switching elements.

3. A television receiver channel selector for selecting one from among a plurality of channel tuning frequencies, comprising:
   a tuning circuit tunable to said plurality of channel tuning frequencies, including variable capacitance diodes as tuning elements;
   a plurality of voltage supply circuits for supplying at outputs thereof tuning voltages corresponding to said plurality of channel tuning frequencies;
   binary memory circuit means having a plurality of outputs for producing binary coded information signals corresponding to said channel tuning frequencies, said binary memory circuit means comprising a binary counter including N flip-flop circuits for generating a first set of binary coded information signals corresponding to said channel tuning frequencies;
   binary decoder means having a first plurality of terminals coupled to the corresponding outputs of said binary memory circuit means and a second plurality of terminals coupled to the outputs of said voltage supply circuits;

means for selectively connecting the outputs of said voltage supply circuits to said variable capacitance diodes for tuning said tuning circuit to one of said channel tuning frequencies, including means selectively connecting the output of one of said voltage supply circuits to said variable capacitance diodes to tune said tuning circuit to the corresponding channel tuning frequency and disconnecting the outputs of all others of said voltage supply circuits from said variable capacitance diodes, the selective connection of said one voltage supply circuit and disconnection of said all other voltage supply circuits being controlled by a signal appearing on a given one of said second plurality of decoder means terminals;

channel selecting means for generating a second set of binary coded information signals corresponding to desired channels to be tuned;

indicating means for sequentially indicating a tuned channel, including drive means for sequentially stepping said indicating means;

pulse generating means coupled to said indicating means for generating a pulse each time said indicating means is stepped by said drive means, the output of said pulse generating means being coupled to the input of said binary counter to step said counter each time a pulse is produced by said pulse generating means;

means for comparing said first and second sets of binary coded information signals and producing an output signal upon the detection by said comparing means of coincidence between said first and second sets of signals; and switching means connected between said comparing means and said indicator drive means for permitting said drive means to step said indicating means by the output signal of said comparing means when said first set of signals do not coincide with said second set of signals, and said switching means being cut off by the output signal of said comprising means for shutting off said drive means when said first set of signals coincide with said second set of signals.

4. A television receiver channel selector for selecting one from among a plurality of channel tuning frequencies, comprising:

a tuning circuit tunable to said plurality of channel tuning frequencies, including variable capacitance diodes as tuning elements;

a plurality of voltage supply circuits for supplying at outputs thereof tuning voltages corresponding to said plurality of channel tuning frequencies;

binary memory circuit means having a plurality of outputs for producing binary coded information signals corresponding to said channel tuning frequencies, said memory circuit comprising a binary counter circuit having a plurality of flip-flop circuits each having an input terminal and a pair of output terminals;

binary decoder means having a plurality of complementary pairs of input terminals connected to respective pairs of said flip-flop circuit output terminals and a further plurality of terminals coupled to the outputs of said voltage supply circuits;

means for selectively connecting the outputs of said voltage supply circuits to said variable capacitance diodes for tuning said tuning circuit to one of said channel tuning frequencies, including means selectively connecting the output of one of said voltage supply circuits to said variable capacitance diodes to tune said tuning circuit to the corresponding channel tuning frequency and disconnecting the outputs of all others of said voltage supply circuits from said variable capacitance diodes, the selective connection of said one voltage supply circuit and disconnection of said all other voltage supply circuits being controlled by a given binary decoder means output;

a pulse generator circuit coupled to an input of said binary counter circuit for supplying pulses in sequence to said counter circuit and switch means for controlling the supply of pulses from said pulse generator to said counter circuit; and means for connecting said flip-flop circuits in a sequential connection, including switching means for connecting the pair of output terminals of any one of said flip-flop circuits to the input terminal of the subsequent flip-flop circuit, wherein the pulses of said pulse generator circuit are applied to the first flip-flop circuit of said sequential connection.

5. A television receiver channel selector for selecting one from among a plurality of channel tuning frequencies, comprising:

a tuning circuit tunable to said plurality of channel tuning frequencies, including variable capacitance diodes as tuning elements;

a plurality of voltage supply circuits for supplying at outputs thereof tuning voltage corresponding to said plurality of channel tuning frequencies;

binary memory circuit means having a plurality of outputs for producing binary coded information signals corresponding to said channel tuning frequencies, said binary memory circuit means comprising a binary counter including N flip-flop circuits for generating a first set of binary coded information signals corresponding to said channel tuning frequencies;

binary decoder means having a first plurality of terminals coupled to the corresponding outputs of said binary memory circuit means and a second plurality of terminals coupled to the outputs of said voltage supply circuits;

means for selectively connecting the outputs of said voltage supply circuits to said variable capacitance diodes for tuning said tuning circuit to one of said channel tuning frequencies, including means selectively connecting the output of one of said voltage supply circuits to said variable capacitance diodes to tune said tuning circuit to the corresponding channel tuning frequency and disconnecting the outputs of all others of said voltage supply circuits from said variable capacitance diodes, the selective connection of said one voltage supply circuit and disconnection of said all other voltage supply circuits being controlled by a given binary decoder means output;

channel selecting means for generating a second set of binary coded information signals corresponding to desired channels to be tuned;

pulse generating means coupled to an input of said binary counter to step said counter each time a pulse is produced by said pulse generating means to generate said first set of binary coded information signals;

means for comparing said first and second set of binary coded information signals and producing an output signal upon the detection by said comparing means of coincidence between said first and second sets of signals; and means for permitting said pulse generating means to produce a pulse when said comparator means does not produce a coincidence output signal and for preventing said pulse generating means from producing a pulse when said comparator means produces said coincidence output signal.

6. A television receiver channel selector for selecting one from among a plurality of channel tuning frequencies, comprising:

a tuning circuit tunable to said plurality of channel tuning frequencies, including variable capacitance diodes as tuning elements;

a plurality of preset voltage supply circuits, including preset impedances, for supplying at outputs thereof tuning voltages corresponding to said plurality of channel tuning frequencies;

binary memory circuit means having a plurality of outputs for producing binary coded information signals corresponding to said channel tuning frequencies;

binary decoder means having a first plurality of terminals coupled to the corresponding outputs of said binary memory circuit means and a second plurality of terminals coupled to the outputs of said voltage supply circuits;

means for selectively connecting the outputs of said voltage supply circuits to said variable capacitance diodes for tuning said tuning circuit to one of said channel tuning frequencies, including means selectively connecting the output of one of said voltage supply circuits to said variable capacitance diodes to tune said tuning circuit to the corresponding channel tuning frequency and disconnecting the outputs of all others of said voltage supply circuits from said variable capacitance diodes, the selective connection of said one voltage supply circuit and disconnection of said all other voltage supply circuits being controlled by a signal appearing on a given one of said second plurality of decoder means terminals;

a plurality of variable impedance elements each having an intermediate tap, a first terminal connected to ground and a second terminal connected in common to a corresponding second terminal of said binary decoder means and a preset impedance of one of said voltage supply circuits;

a plurality of switching elements having control terminals respectively connected to the second plurality of terminals of said binary decoder means, the corresponding one of said switching elements being urged into conductivity by a signal appearing at said given one of said second plurality of decoder terminals; and a plurality of indicating means connected in series with said respective switching elements;

wherein said selective connection means comprises a diode logic OR gate having an output coupled in common to said variable capacitance diodes and having a plurality of inputs coupled to corresponding ones of the intermediate taps of said variable impedance elements.

7. A television receiver channel selector for selecting one from among a plurality of channel tuning frequencies, comprising:

a tuning circuit tunable to said plurality of channel tuning frequencies, including variable capacitance diodes as tuning elements;

a plurality of preset voltage supply circuits, including preset impedances, for supplying at outputs thereof tuning voltages corresponding to said plurality of channel tuning frequencies;

binary memory circuit means having a plurality of outputs for producing binary coded information signals corresponding to said channel tuning frequencies, said binary memory circuit comprising a binary up-down counter including N flip-flops, a pulse generator circuit for supplying pulses to said binary counter, and switching means for reversibly operating said up-down counter;

binary decoder means having a first plurality of terminals coupled to the corresponding outputs of said binary memory circuit means and a second plurality of terminals coupled to the outputs of said voltage supply circuits;

means for selectively connecting the outputs of said voltage supply circuits to said variable capacitance diodes for tuning said tuning circuit of one of said channel tuning frequencies, including means selectively connecting the output of one of said voltage supply circuits to said variable capacitance diodes to tune said tuning circuits to the corresponding channel tuning frequency and disconnecting the outputs of all others of said voltage supply circuits from said variable capacitance diodes, the selective connection of said one voltage supply circuit and disconnection of said all other voltage supply circuits being controlled by a signal appearing on a given one of said second plurality of decoder means terminals; and a plurality of variable impedance elements each having an intermediate tap, a first terminal connected to ground and a second terminal connected in common to a corresponding second terminal of said binary decoder means and a preset impedance of one of said voltage supply circuits;

wherein said selective connection means comprises a diode logic OR gate having an output coupled in common to said variable capacitance diodes and having a plurality of inputs coupled to corresponding ones of the intermediate taps of said variable impedance elements.

8. A television receiver channel selector for selecting one from among a plurality of channel tuning frequencies, comprising:

a tuning circuit tunable to said plurality of channel tuning frequencies, including variable capacitance diodes as tuning elements;

a plurality of preset voltage supply circuits, including preset impedances, for supplying at outputs thereof tuning voltages corresponding to said plurality of channel tuning frequencies;

binary memory circuit means having a plurality of outputs for producing binary coded information signals indicating pure binary numbers and corresponding to said channel tuning frequencies, said binary memory circuit comprising a binary up-down counter including N flip-flops, a pulse generator circuit for supplying pulses to said binary counter, and switching means for reversibly operating said up-down counter;

binary decoder means having a first plurality of terminals coupled to the corresponding outputs of said binary memory circuit means and a second plurality of terminals coupled to the outputs of said voltage supply circuits;

means for selectively connecting the outputs of said voltage supply circuits to said variable capacitance diodes for tuning said tuning circuit to one of said channel tuning frequencies, including means for selectively connecting the output of one of said voltage supply circuits to said variable capacitance diodes to tune said tuning circuit to the corresponding channel tuning frequency and disconnecting the outputs of all others of said voltage supply circuits from said variable capacitance diodes, the selective connection of said one voltage supply circuit and disconnection of said all other voltage supply circuits being controlled by a signal appearing on a given one of said second plurality of decoder means terminals; and a plurality of variable impedance elements connected in parallel across said preset voltage supply circuits and having intermediate taps connected to the second plurality of terminals of said binary decoder means;

wherein said selective connecting means includes a diode logic OR gate comprising a plurality of diodes having a plurality of input terminals connected to the respective intermediate taps of said impedance elements and having an output terminal connected to said variable capacitance diodes.

* * * * *